(12) United States Patent
Park et al.

(10) Patent No.: US 9,818,889 B2
(45) Date of Patent: Nov. 14, 2017

(54) COMPOSITION FOR SOLAR CELL ELECTRODES AND ELECTRODE FABRICATED USING THE SAME

(71) Applicants: Sang Hee Park, Uiwang-si (KR); Tae Joon Kim, Uiwang-si (KR); Hun Gyu Song, Uiwang-si (KR)

(72) Inventors: Sang Hee Park, Uiwang-si (KR); Tae Joon Kim, Uiwang-si (KR); Hun Gyu Song, Uiwang-si (KR)

(73) Assignee: Cheil Industrial, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/107,489

(22) Filed: Dec. 16, 2013

(65) Prior Publication Data

US 2014/0182672 A1   Jul. 3, 2014

(30) Foreign Application Priority Data

Dec. 29, 2012  (KR) .......................... 10-2012-0157693

(51) Int. Cl.
  *C03C 8/18*  (2006.01)
  *H01B 1/16*  (2006.01)
  *C03C 8/22*  (2006.01)
  *H01L 31/0224*  (2006.01)

(52) U.S. Cl.
  CPC ........ *H01L 31/022425* (2013.01); *C03C 8/18* (2013.01); *C03C 8/22* (2013.01); *H01B 1/16* (2013.01); *Y02E 10/50* (2013.01)

(58) Field of Classification Search
  CPC ......... H01L 31/022425; H01L 31/0264; H01L 31/1804; H01L 31/02425; H01L 31/22;
  (Continued)

(56) References Cited

U.S. PATENT DOCUMENTS

2009/0101190 A1* 4/2009 Salami .................... C03C 3/062
                                                          136/244
2009/0266409 A1  10/2009 Wang et al.
(Continued)

FOREIGN PATENT DOCUMENTS

CN     102017011 A    4/2011
CN     102149629 A    8/2011
(Continued)

OTHER PUBLICATIONS

Tsutomu Minami, Infared Spectra, Glass Transition Temperature, and Conductivity of Superionic Conducting Glasses in the Systems AgX—Ag2O—B2O3 (X=I, Br), Journal of Non-Crystalline Solids 52 (1982) 159-169.*

(Continued)

*Primary Examiner* — Jeffrey T Barton
*Assistant Examiner* — Michael Y Sun
(74) *Attorney, Agent, or Firm* — Lee & Morse, P.C.

(57) ABSTRACT

A composition for solar cell electrodes, a solar cell electrode prepared from the composition, a solar cell, and a method of manufacturing the same, the composition including silver powder; silver iodide; glass frit; and an organic vehicle, wherein the silver iodide is present in an amount of about 0.1 wt % to about 30 wt %, based on a total weight of the composition.

10 Claims, 1 Drawing Sheet

(58) Field of Classification Search
CPC . H01L 31/18; H01L 31/028; H01L 31/02167;
H01L 31/02245; H01L 31/022458; H01L
31/022408; H01L 31/02008; H01L
31/0504; H01L 31/02168; H01L 31/0512;
H01L 31/0256; H01L 31/068; H01L
31/1884; H01L 31/0224; H01L 31/03529;
H01L 31/022441; H01L 31/0236; H01L
31/1868; H01L 2924/0002; H01B 1/16;
H01B 1/22; H05K 1/092; H05K 1/095;
C03C 8/18; C03C 8/22; C03C 8/02;
C03C 8/04; C03C 8/06; C03C 8/10;
C03C 8/16; C03C 3/12; C03C 3/072;
C03C 8/14; C03C 14/006; C03C 2214/08;
C03C 2214/16; C03C 3/066; C03C 3/064;
C03C 3/062; C22C 32/0036; C22C
32/001; Y02E 10/50; Y02E 10/547; Y02P
70/521
See application file for complete search history.

(56) References Cited

U.S. PATENT DOCUMENTS

| | | | | |
|---|---|---|---|---|
| 2011/0175036 | A1* | 7/2011 | Masahiro et al. | 252/500 |
| 2011/0227004 | A1* | 9/2011 | Jung | H01B 1/22 252/513 |

FOREIGN PATENT DOCUMENTS

| | | | |
|---|---|---|---|
| CN | 102194537 | A | 9/2011 |
| CN | 102456427 | A | 5/2012 |
| CN | 102568645 | A | 7/2012 |
| CN | 102709341 | A | 10/2012 |
| KR | 10-2010-0031475 | A | 3/2010 |
| KR | 1020100031475 | A * | 3/2010 |
| KR | 10-2012-0078109 | A | 7/2012 |
| KR | 1020120078109 | A * | 7/2012 |
| WO | WO 2013/142180 | A1 | 9/2013 |

OTHER PUBLICATIONS

Korean Office Action for 10-2012-0157693 dated Mar. 30, 2015; Park, et al.
Tsutomu Minami, et al., "Infrared Spectra, Glass Transition Temperature, and Conductivity of Superionic Conducting Glasses in the Systems AgX—Ag$_2$O—B$_2$O$_3$ (X=1, Br)", Journal of Non-Crystalline Solids 52(1982) 159-169.
Office Action dated Sep. 25, 2015 in corresponding Chinese Patent Application No. 201310686572.5.
Chinese Office Action dated Apr. 22, 2016 in Corresponding Chinese Patent Application No. 201310686572.5.

* cited by examiner

COMPOSITION FOR SOLAR CELL ELECTRODES AND ELECTRODE FABRICATED USING THE SAME

CROSS-REFERENCE TO RELATED APPLICATION

Korean Patent Application No. 10-2012-0157693, filed on Dec. 29, 2012, in the Korean Intellectual Property Office, and entitled: "Composition For Solar Cell Electrodes and Electrode Fabricated Using The Same," is incorporated by reference herein in its entirety.

BACKGROUND

1. Field

Embodiments relate to a composition for solar cell electrodes and an electrode fabricated using the same.

2. Description of the Related Art

Solar cells may generate electricity using the photovoltaic effect of a p-n junction, which converts photons of sunlight into electricity. In the solar cell, front and rear electrodes may be formed on upper and lower surfaces of a semiconductor wafer or substrate with the p-n junctions, respectively. Then, the photovoltaic effect at the p-n junction may be induced by sunlight or other light entering the semiconductor wafer, and electrons generated by the photovoltaic effect at the p-n junction may provide electric current to the outside through the electrodes. The electrodes of the solar cell may be formed on the wafer by, e.g., applying, patterning, and baking an electrode composition.

SUMMARY

Embodiments are directed to a composition for solar cell electrodes and an electrode fabricated using the same.

The embodiments may be provided by realizing a composition for solar cell electrodes, the composition including silver powder; silver iodide; glass frit; and an organic vehicle, wherein the silver iodide is present in an amount of about 0.1 wt % to about 30 wt %, based on a total weight of the composition.

The composition may include about 60 wt % to about 95 wt % of the silver powder, the about 0.1 wt % to about 30 wt % of the silver iodide, about 0.5 wt % to about 20 wt % of the glass fit, and about 1 wt % to about 30 wt % of the organic vehicle.

The glass fit may include one or more of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide-tellurium oxide-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), or tellurium oxide-zinc oxide ($TeO_2$—$ZnO$) glass frits.

The glass frit may include two types of glass frit having different glass transition points.

The glass frit may include a first glass fit having a glass transition point ranging from 200° C. to 350° C. and a second glass frit having a glass transition point of more than 350° C. and less than or equal to 550° C., a weight ratio of the first glass fit to the second glass frit ranging from about 1:0.2 to about 1:1.

The glass frit may have an average particle diameter D50 of about 0.1 μm to about 10 μm.

The composition may further include one or more of a dispersant, a thixotropic agent, a plasticizer, a viscosity stabilizer, an anti-foaming agent, a pigment, a UV stabilizer, an antioxidant, or a coupling agent.

The embodiments may also be provided by realizing a solar cell electrode prepared from the composition for solar cell electrodes according to an embodiment.

The embodiments may also be provided by realizing a solar cell including a semiconductor substrate; and an electrode in contact with the semiconductor substrate, the electrode including silver, glass frit, and silver iodide.

The embodiments may also be provided by realizing a method of manufacturing a solar cell, the method including forming an electrode on a semiconductor substrate, forming the electrode including applying the composition according to an embodiment on the substrate, patterning the applied composition, and baking the semiconductor substrate having the patterned composition thereon.

BRIEF DESCRIPTION OF DRAWINGS

Features will be apparent to those of skill in the art by describing in detail exemplary embodiments with reference to the attached drawings in which.

DETAILED DESCRIPTION

Figure 1:
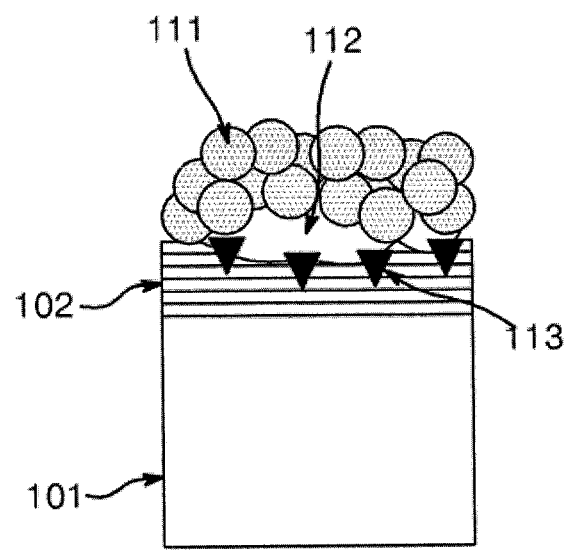
FIG. 1 illustrates a conceptual view of a process for forming silver crystal grains by baking silver powder and a glass frit on a wafer.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Composition for Solar Cell Electrodes

A composition for solar cell electrodes according to an embodiment may include, e.g., silver (Ag) powder (A); silver iodide (B); a glass frit (C); and an organic vehicle (D).

Now, each component of the composition for solar cell electrodes according to an embodiment will be described in more detail.

Silver Powder

The composition for solar cell electrodes according to an embodiment may include silver powder as a first metal powder, which is conductive powder. A particle size of the silver powder may be on a nanometer or micrometer scale. For example, the silver powder may have a particle size of dozens to several hundred nanometers, or several to dozens of micrometers. In an implementation, the silver powder may be a mixture of two or more types of silver powders having different particle sizes.

The silver powder may have, e.g., a spherical, flake, or amorphous shape.

The silver powder may have an average particle diameter (D50) of about 0.1 μm to about 10 μm, e.g., about 0.5 μm to about 5 μm. The average particle diameter may be measured using, e.g., a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in the composition in an amount of about 60 wt % to about 95 wt %, based on a total weight of the composition. Within this range, the conductive powder may help reduce and/or prevent a deterioration in conversion efficiency, which may otherwise occur due to an increase in resistance. In an implementation, the conductive powder may be present in an amount of about 70 wt % to about 90 wt %.

(B) Silver Iodide

The solar cell electrode may be formed by printing and baking the composition on a silicon wafer, wherein the composition includes silver iodide, as well as the conductive powder, the glass frit, and the organic vehicle.

Referring to FIG. 1, during the baking process, the silver (Ag) powder 111 may be melted, and the glass frit 112 may serve to etch an anti-reflection layer of the wafer (that includes a p-layer (or n-layer) 101 and an n-layer (or p-layer) 102), which will serve as an emitter. Then, the melted silver powder may permeate a surface of the wafer and may form silver crystals 113, thereby forming an electrode. In this case, sufficient ohmic depth of the silver crystals may be secured and sufficient contact area between the silver crystals and the wafer may also be secured. The composition for solar cell electrodes according to an embodiment may include the silver iodide (AgI) (having a melting point of about 558° C., which is lower than the melting point of elemental silver). The silver iodide may be changed into a liquid faster than silver at a temperature lower than the baking temperature of electrodes. Thus, the liquid silver iodide may fill fine cracks on the silicon wafer or an empty space that may be formed at a contact surface between the composition and the wafer due to surface roughness, thereby improving contact efficiency between the electrodes and the silicon wafer.

For example, silver iodide (AgI) may facilitate ohmic contact between the wafer and silver by reducing a Schottky barrier height between the metal and semiconductor at an interface between the wafer and silver, and may increase fill factor due to reduction in contact resistance (Rc) and serial resistance (Rs) of the silver electrode wafer, thereby enhancing solar cell efficiency. Furthermore, silver chloride (AgCl) may be very harmful to humans upon inhalation, ingestion, or skin contact, whereas silver iodide may have comparatively outstanding properties in terms of environmental safety and workability.

According to an embodiment, the silver iodide (AgI) may be present in the composition in an amount of about 0.1 wt % to about 30 wt %, based on the total weight of the composition. Within this range, the silver iodide may help secure sufficient bonding stability given varying surface resistances and may help minimize serial resistance.

(C) Glass Frit

The glass frit may help enhance adhesion between the conductive powder and the wafer or the substrate and form silver crystal grains in an emitter region by etching an anti-reflection layer and melting the silver powder so as to reduce contact resistance during the baking process of the composition for electrodes. Further, during the baking process, the glass frit may soften and decrease the baking temperature.

When an area of the solar cell is increased in order to improve solar cell efficiency, solar cell contact resistance may increase. Thus, both serial resistance (Rs) and influence on the p-n junction should be minimized. In addition, as the baking temperature may vary within a broad range with increasing use of various wafers having different sheet resistances, it may be desirable for the glass frit to secure sufficient thermal stability to withstand a wide range of baking temperatures.

The glass frit may include any of a suitable leaded glass frit or a suitable lead-free glass frit.

In an implementation, the glass frit may include at least one metal oxide selected from the group of lead oxide, silicon oxide, tellurium oxide, bismuth oxide, zinc oxide, boron oxide, aluminum oxide, tungsten oxide, or combinations thereof. For example, the glass fit may include at least one selected from the group of zinc oxide-silicon oxide ($ZnO$—$SiO_2$), zinc oxide-boron oxide-silicon oxide ($ZnO$—$B_2O_3$—$SiO_2$), zinc oxide-boron oxide-silicon oxide-aluminum oxide ($ZnO$—$B_2O_3$—$SiO_2$—$Al_2O_3$), bismuth oxide ($Bi_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$—$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$), lead oxide (PbO), lead oxide-tellurium oxide ($PbO$—$TeO_2$), lead oxide-tellurium oxide-silicon oxide ($PbO$—$TeO_2$—$SiO_2$), lead oxide-tellurium oxide-lithium oxide ($PbO$—$TeO_2$—$Li_2O$), bismuth oxide-tellurium oxide ($Bi_2O_3$—$TeO_2$), bismuth oxide-tellurium oxide-silicon oxide ($Bi_2O_3$—$TeO_2$—$SiO_2$), bismuth oxide-tellurium oxide-lithium oxide ($Bi_2O_3$—$TeO_2$—$Li_2O$), tellurium oxide ($TeO_2$), or tellurium oxide-zinc oxide ($TeO_2$—$ZnO$) glass fits.

The glass frit may have an average particle diameter D50 of about 0.1 μm to about 10 μm. The glass frit may be present in the composition in an amount of about 0.5 wt % to about 20 wt %, based on the total weight of the composition. The glass fit may have a spherical or amorphous shape. In an implementation, a mixture of two types of glass frits having different glass transition points may be used for the composition. For example, a mixture of a first glass fit (having a glass transition point ranging from 200° C. to 350° C.) and a second glass fit (having a glass transition point of more than 350° C. and less than or equal to 550° C.) may be used. In an implementation, a weight ratio of the first glass frit to the second glass frit may range from about 1:0.2 to about 1:1.

The glass frit may be prepared from suitable metal oxides by a suitable method. For example, the metal oxides may be mixed in a predetermined ratio. Mixing may be carried out using, e.g., a ball mill or a planetary mill. The mixture may be melted at about 700° C. to about 1,300° C., followed by quenching to about 25° C. The obtained resultant may be subjected to pulverization using, e.g., a disk mill, a planetary mill, or the like, thereby preparing a glass frit.

(D) Organic Vehicle

The organic vehicle may impart suitable viscosity and rheological characteristics for printing to the composition for solar cell electrodes through mechanical mixing with the other, e.g., inorganic, components of the composition.

The organic vehicle may include a suitable organic vehicle for solar cell electrode compositions, e.g., a binder resin, a solvent, or the like.

The binder resin may be selected from, e.g., acrylate resins or cellulose resins. In an implementation, ethyl cellulose may be used as the binder resin. In an implementation, the binder resin may be selected from among ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, or the like.

The solvent may be selected from the group of, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, or combinations thereof.

The organic vehicle may be present in the composition in an amount of about 1 wt % to about 30 wt %, based on the total weight of the composition. Within this range, the organic vehicle may provide sufficient adhesive strength and excellent printability to the composition.

Additive

The composition may further include an additive, as desired, to, e.g., enhance flow properties, process properties, and stability. The additive may include, e.g., a dispersant, a thixotropic agent, a plasticizer, a viscosity stabilizer, an anti-foaming agent, a pigment, a UV stabilizer, an antioxidant, a coupling agent, or the like. The additive may be used alone or as mixtures thereof. The additive may be present in the composition in an amount of about 0.1 wt % to about 5 wt %.

Solar Cell Electrode and Solar Cell Including the Same

Figure 2:
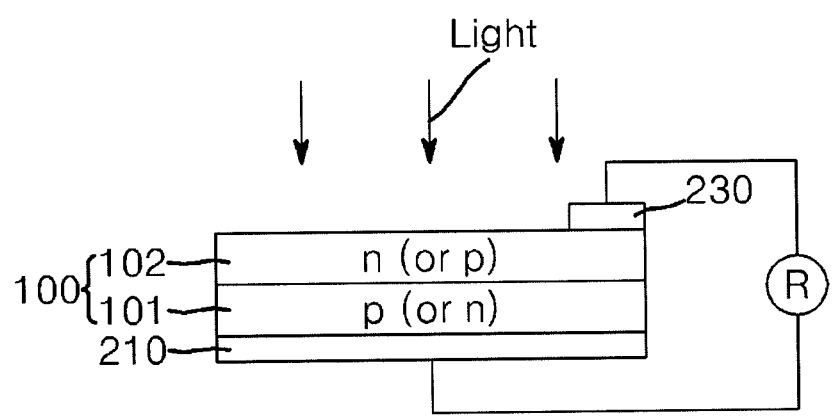
FIG. 2 illustrates a schematic view of a solar cell in accordance with one embodiment of the present invention.

An embodiment provides an electrode prepared from the composition for solar cell electrodes, and a solar cell including the same. FIG. 2 illustrates a solar cell in accordance with an embodiment.

Referring to FIG. 2, a rear electrode 210 and a front electrode 230 may be formed by printing and baking the composition on a wafer or substrate 100 (that includes a p-layer (or n-layer) 101 and an n-layer (or p-layer) 102), which may serve as an emitter. For example, a preliminary process of preparing the rear electrode 210 may be performed by printing the composition on the rear surface of the wafer 100 and drying the printed composition at about 200° C. to about 400° C. for about 10 seconds to about 60 seconds. Further, a preliminary process for preparing the front electrode may be performed by printing the composition on the front surface of the wafer and drying the printed composition. Then, the front electrode 230 and the rear electrode 210 may be formed by baking the wafer at about 400° C. to about 950° C., e.g., at about 750° C. to about 950° C., for about 30 seconds to about 180 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

As an organic binder, 1 wt % of ethylcellulose (STD4, Dow Chemical Company) was sufficiently dissolved in 8.5 wt % of butyl carbitol at 60° C. to prepare a binder solution. 86.5 wt % of spherical silver powder (AG-4-8, Dowa Hightech Co., Ltd.) having an average particle diameter of 2.0 μm, 0.5 wt % of silver iodide, 2.0 wt % of a low melting point leaded glass frit-1 (leaded glass, CI-124, Particlogy Co., Ltd.) having an average particle diameter of 1.0 μm and a glass transition point of 341° C., 1.0 wt % of a low melting point leaded glass frit-2 (leaded glass, CI-5008, Particlogy Co., Ltd.) having an average particle diameter of 1.0 μm and a glass transition point of 430° C., 0.2 wt % of a dispersant BYK102 (BYK-chemie), and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

Examples 2 to 3 and Comparative Examples 1 and 2

Compositions for solar cell electrodes were prepared in the same manner as in Example 1, except that the compositions were prepared in amounts as listed in Table 1, below. Experimental results are shown in Table 1.

Measurement Method of Contact Resistance and Specific Contact Resistivity

The compositions prepared according to the Examples and Comparative Examples were deposited onto a front surface of a monocrystalline wafer by screen printing in a predetermined pattern, followed by drying in an IR drying furnace. Cells formed according to this procedure were subjected to baking at 600° C. to 1,000° C. for 60 seconds to 210 seconds in a belt-type baking furnace, and then evaluated as to contact resistance (Rs) and specific contact resistivity (ρc) using a TLM (Transfer Length Method) tester. The measured contact resistance and specific contact resistivity are shown in Table 1.

Measurement method of Fill Factor and Conversion Efficiency

The compositions prepared according to the Examples and Comparative Examples were deposited over a front surface of a monocrystalline wafer by screen printing in a predetermined pattern, followed by drying in an IR drying furnace. Then, the composition for electrodes containing aluminum was printed on a rear side of the wafer and dried in the same manner as above. Cells formed according to this procedure were subjected to baking at 400° C. to 1,000° C. for 30 seconds to 180 seconds in a belt-type baking furnace, and evaluated as to Fill Factor (FF, %) and conversion efficiency (%) using a solar cell efficiency tester CT-801 (Pasan Co., Ltd.). The measured fill factor and conversion efficiency are shown in Table 1.

TABLE 1

| | Example 1 | Example 2 | Example 3 | Comparative Example 1 | Comparative Example 2 |
|---|---|---|---|---|---|
| | | | | | (Unit: wt %) |
| Silver (Ag) powder | 86.5 | 85 | 77 | 87 | 47 |
| Silver iodide | 0.5 | 2 | 10 | — | 40 |
| Glass frit 1 | 2 | 2 | 2 | 2 | 2 |
| Glass frit 2 | 1 | 1 | 1 | 1 | 1 |
| Organic vehicle Binder Solution | 1 | 1 | 1 | 1 | 1 |
| | 8.5 | 8.5 | 8.5 | 8.5 | 8.5 |
| Additives | 0.5 | 0.5 | 0.5 | 0.5 | 0.5 |
| Contact Resistance (mΩ) | 0.5211 | 0.4259 | 0.4120 | 0.9435 | 0.8584 |
| Specific contact resistivity (mΩ · cm$^2$) | 0.9031 | 0.7002 | 0.6379 | 2.0125 | 1.8652 |
| Fill Factor | 76.4874 | 76.6874 | 76.9158 | 73.8286 | 74.6685 |
| Efficiency (%) | 16.9564 | 16.9784 | 17.0952 | 16.0458 | 16.2845 |

As may be seen in Table 1, the solar cell electrodes fabricated using the compositions prepared in Examples 1 to 3 exhibited low contact resistance and specific contact resistivity, thereby providing excellent fill factor and conversion efficiency, as compared with those of Comparative Examples 1 and 2.

By way of summation and review, continuous reduction in emitter thickness to improve solar cell efficiency may cause shunting, which may deteriorate solar cell performance. In addition, solar cells have gradually been increased in area to achieve higher efficiency. In this case, however, there efficiency may deteriorate due to increase in solar cell contact resistance.

The embodiments may provide a composition for solar cell electrodes that may help enhance contact efficiency between electrodes and a silicon wafer to help minimize contact resistance (Rc) and serial resistance (Rs), thereby providing excellent conversion efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for solar cell electrodes, the composition comprising:
    silver powder;
    silver iodide;
    glass frit, the glass frit including a first glass frit having a glass transition point ranging from 200° C. to 350° C. and a second glass fit having a glass transition point of more than 350° C. and less than or equal to 550° C., a weight ratio of the first glass frit to the second glass fit ranging from about 1:0.2 to about 1:1; and
    an organic vehicle, wherein:
    the silver iodide is present in an amount of about 0.5 wt % to about 10 wt %, based on a total weight of the composition.

2. The composition as claimed in claim 1, wherein the composition includes:
    about 60 wt % to about 95 wt % of the silver powder,
    the about 0.5 wt % to about 10 wt % of the silver iodide,
    about 0.5 wt % to about 20 wt % of the glass fit, and
    about 1 wt % to about 30 wt % of the organic vehicle.

3. The composition as claimed in claim 1, wherein the glass frit includes one or more of zinc oxide-silicon oxide (ZnO—SiO$_2$), zinc oxide-boron oxide-silicon oxide (ZnO—B$_2$O$_3$—SiO$_2$), zinc oxide-boron oxide-silicon oxide-aluminum oxide (ZnO—B$_2$O$_3$—SiO$_2$—Al$_2$O$_3$), bismuth oxide (Bi$_2$O$_3$), bismuth oxide-silicon oxide (Bi$_2$O$_3$—SiO$_2$), bismuth oxide-boron oxide-silicon oxide (Bi$_2$O$_3$—B$_2$O$_3$—SiO$_2$), bismuth oxide-boron oxide-silicon oxide-aluminum oxide (Bi$_2$O$_3$—B$_2$O$_3$—SiO$_2$—Al$_2$O$_3$), bismuth oxide-zinc oxide-boron oxide-silicon oxide (Bi$_2$O$_3$—ZnO—B$_2$O$_3$—SiO$_2$), bismuth oxide-zinc oxide-boron oxide-silicon oxide-aluminum oxide (Bi$_2$O$_3$—ZnO—B$_2$O$_3$—SiO$_2$—Al$_2$O$_3$), lead oxide (PbO), lead oxide-tellurium oxide (PbO—TeO$_2$), lead oxide-tellurium oxide-silicon oxide (PbO—TeO$_2$—SiO$_2$), lead oxide-tellurium oxide-lithium oxide (PbO—TeO$_2$—Li$_2$O), bismuth oxide-tellurium oxide (Bi$_2$O$_3$—TeO$_2$), bismuth oxide-tellurium oxide-silicon oxide (Bi$_2$O$_3$—TeO$_2$—SiO$_2$), bismuth oxide-tellurium oxide-lithium oxide (Bi$_2$O$_3$—TeO$_2$—Li$_2$O), tellurium oxide (TeO$_2$), or tellurium oxide-zinc oxide (TeO$_2$—ZnO) glass frits.

4. The composition as claimed in claim 1, wherein the glass fit has an average particle diameter D50 of about 0.1 μm to about 10 μm.

5. The composition as claimed in claim 1, further comprising one or more of a dispersant, a thixotropic agent, a plasticizer, a viscosity stabilizer, an anti-foaming agent, a pigment, a UV stabilizer, an antioxidant, or a coupling agent.

6. A solar cell electrode prepared from the composition for solar cell electrodes as claimed in claim 1.

7. A method of manufacturing a solar cell, the method comprising forming an electrode on a semiconductor substrate, forming the electrode including:
    applying the composition as claimed in claim 1 on the substrate,
    patterning the applied composition, and
    baking the semiconductor substrate having the patterned composition thereon.

8. A solar cell manufactured according to the method as claimed in claim 7.

9. A solar cell having an electrode, the electrode being manufactured using the composition as claimed in claim 1.

10. The composition as claimed in claim 1, wherein the composition has a baking temperature of 400° C. to 950° C.

* * * * *